United States Patent
Park et al.

(10) Patent No.: US 7,397,068 B2
(45) Date of Patent: Jul. 8, 2008

(54) SOLID STATE LIGHTING DEVICE

(75) Inventors: Jae M. Park, San Jose, CA (US); Teck-Gyu Kang, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 250 days.

(21) Appl. No.: 11/010,077

(22) Filed: Dec. 9, 2004

(65) Prior Publication Data

US 2005/0133800 A1    Jun. 23, 2005

Related U.S. Application Data

(60) Provisional application No. 60/532,678, filed on Dec. 23, 2003, provisional application No. 60/532,340, filed on Dec. 23, 2003.

(51) Int. Cl.
    *H01L 33/00*    (2006.01)
(52) U.S. Cl. ............... 257/88; 257/89; 257/98; 257/99; 257/E33.001
(58) Field of Classification Search ............ 257/79, 257/39, 100, 103, E25.021, E33.061, 88–89; 345/39–40; 313/503
    See application file for complete search history.

(56) References Cited

U.S. PATENT DOCUMENTS

| | | | | | |
|---|---|---|---|---|---|
| 4,900,910 | A | * | 2/1990 | Doi | 250/201.5 |
| RE35,665 | E | * | 11/1997 | Lin et al. | 257/94 |
| 6,044,548 | A | * | 4/2000 | Distefano et al. | 29/840 |
| 6,790,684 | B2 | * | 9/2004 | Ahn et al. | 438/14 |
| 6,793,829 | B2 | * | 9/2004 | Platt et al. | 216/2 |
| 6,864,627 | B2 | * | 3/2005 | Komoto et al. | 313/503 |
| 6,961,190 | B1 | * | 11/2005 | Tamaoki et al. | 359/726 |
| 7,064,354 | B2 | * | 6/2006 | Chen | 257/89 |
| 2003/0174504 | A1 | * | 9/2003 | Tamaoki | 362/470 |
| 2004/0129944 | A1 | * | 7/2004 | Chen | 257/89 |

* cited by examiner

*Primary Examiner*—Wai-Sing Louie
(74) *Attorney, Agent, or Firm*—Lerner, David, Littenberg, Krumholz & Mentlik, LLP

(57) ABSTRACT

A light assembly for use with a low voltage power source. The light assembly semiconductor photo-emitters are electrically in series with a higher forward voltage drop than the associated low voltage power supply. To provide the necessary voltage the light assembly includes a current regulated step-up DC/DC converter. The semiconductor photo-emitters that are electrically in series are in the form of a monolithic light emitting diode array with a plurality of light emitting diode elements electrically and mechanically in series with a conductive, rigid bond region between the cathode region of the first light emitting diode element and the anode region of the second light emitting diode element. The first and second light emitting diode elements may differ in band gaps to emit different colors, that are additive to a non-primary color, such as white.

15 Claims, 11 Drawing Sheets

SOLID STATE LIGHTING DEVICE

CROSS-REFERENCE TO RELATED APPLICATIONS

This application claims the benefit of the filing dates of U.S. Provisional Application No. 60/532,678, filed Dec. 23, 2003, and U.S. Provisional Application No. 60/532,340, filed Dec. 23, 2003, the disclosures of which are incorporated by reference herein.

BACKGROUND OF THE INVENTION

1. Field of the Invention

Our invention relates to battery powered lighting devices, as flashlights, emergency lights, and the like, having solid state semiconductor photo-emitters, typically multiple light emitting diodes, as the lighting source. Our invention further relates to an LED (light emitting diode) series array for use, for example, in lighting devices.

2. Background

High power light emitting diode ("LED") portable lights, for example flashlights, emergency lights, cave lights, and the like are gaining market share. Traditional light bulbs produce light by heating a filament to its incandescence temperature. This is wasteful of energy, especially stored energy, because as much as four fifths of the light is lost as ohmic heating, that is, $I^2R$ heating, and only one fifth of the energy into light. By way of contrast, light emitting diodes do not rely on heating a filament to incandescence, but on carrier injection. Thus, LEDs have much less energy loss through incandescent heating. As a result they are more efficient then incandescent lights.

A further advantage of LEDs is that they are long lived. An LED will last from 10,000 hours to 100,000 hours or more. Additionally, LEDs are encased in high strength, optical grade polymers, such as optical grade epoxy or silicone resins. Without a glass or filament to break, LEDs are desirable for hostile environments.

Previously, LEDs did not produce enough light for true flashlight or emergency light use. However, new LED products are entering the marketplace, and these new products provide high illumination.

In a conventional LED array, a plurality of LEDs (which individually emit individual light beams of bandgap determined wavelengths) are arranged in a line substrate. The light beams from the individual LEDs are converged by a lens, as a fresnel lens or a rod lens. The lens is placed at a fixed spacing from the LEDs, so as to provide the desired illumination.

While white light is desired, it is not emitted by semiconductor light emitting diodes. In the LED array of this type, one LED may emit green light of a wavelength of 555 nm, may be used in conjunction with an LED which emits yellowish-green light of a wavelength of 565 nm. These LEDs may be used with LED, which is capable of emitting red light of the wavelength of 635 nm has.

When the above-mentioned LEDs for emitting red light, which is reflected by the red portions because of its wavelength, is used in the LED array, the red portions in the original reflect the red light, so that the image sensor is not capable of reading the red portions. Thus, when the LED array is provided with the LEDs for emitting green or yellowish green light and the LEDs for emitting red light, the subject is irradiated with red light, as well as green or yellowish-green light, so that the subject appears to be lit by white light.

However, in order to obtain an LED array in which different types of LEDs of different wavelengths are used to emit light beams at wavelengths at these different wavelengths in order to additively produce white light a very large number of lead wires are necessary, resulting in an LED array with complicated wiring that is expensive to manufacture.

Another problem with the new, high power LED flashlights is that blue LEDs, which are required to produce white light, have a forward voltage of 3.3 to 4.0 volts, and typically about 3.5 volts. The design issue is that most consumer batteries have a cell voltage of 1.35 to 1.50 volt nominal. This means that three batteries must be used in an LED flashlight. This is an output of 4.05 to 4.50 volts to produce white light. This voltage level, 4.05 to 4.50 volts cannot be directly applied to a 3.3 to 4.0 volt LED. The high voltage will damage the LED, and significantly shorten its life.

In order to overcome this problem, a current limiting resistor has heretofore been proposed, dropping about 1.00 volt. This is about 18 to 22 percent of the battery's power, and represents significant waste; especially where portability and long time between battery recharges is desired.

Moreover, in order to use the energy stored in the batteries more efficiently, certain efficiencies are obtained by operating series connected LEDs at still higher voltages. For example, with an LED series circuit having LEDs whose emissions add up to white light, a series circuit of eight LEDs can be operated to give white light at an applied voltage of 28 volts.

Since the response time of a solid state lighting device is on the order of nanoseconds, while the human eye does not perceive flicker at frequency approaching and above 100 hertz, the power supply can operate with a short duty cycle, for example, as low as about ten percent, with short, high current pulses, at high electrical efficiency.

Thus, a clear need exists for a low cost "white light" light emitting diode array that is characterized by a high degree of manufacturability, for use in a solid state lighting device. The solid state lighting device requires a step up power supply, preferably operating in a pulse mode, at nanosecond level pulses.

SUMMARY OF THE INVENTION

One aspect of our invention is a solid state lighting device with a step up power supply, preferably operating in a pulse mode, at nanosecond level pulses. More particularly, the lighting device includes a semiconductor light emitting assembly for use with a low voltage power source. The light source a plurality of semiconductor photo-emitters electrically in series, where the light emitter series has a higher forward voltage drop than an associated low voltage power supply. The light source also includes current regulated step-up DC/DC converter for stepping up voltage from the associated low voltage power source to said semiconductor light emitter series.

In one example of the invention the current regulated step-up DC/DC converter has an input inductor in series with the low voltage power supply, an output circuit including an output diode electrically in series with a resistor load and capacitor circuit; and a switch that is located between the input inductor and, a ground, and an output circuit. When the switch is on the voltage across the output circuit reverse biases the output diode and the low voltage power source charges the input inductor. When the switch is off the output diode is forward biased allowing energy to pass to the output circuit and cause the semiconductor photo-emitter to turn on. This switch may be a MOSFET transistor having balanced on resistance and gate charge.

When the switch includes MOSFET first and second transistors in parallel, the first transistor is typically smaller in size and has less dynamic loss then the second transistor and is controlled to supply load during switching. The second transistor is larger in size and has less conduction loss than the first transistor. The second transistor is controlled to be off during switching and on to supply current to the output circuit during on cycles. In one example, at least one of the MOSFET transistors is an NMOS transistor.

The output diode in the output circuit that is electrically in series with a resistor load and capacitor circuit is a Schottky diode.

In a preferred example of the invention the light assembly is a single package carrying both the semiconductor photo-emitters and the step-up DC/DC converter.

In a further example, the system includes a battery charger comprising an input for a charging current, a current control element, and a voltage regulator for delivering charging current to a battery to be charged. This package may include the semiconductor photo-emitters, the step-up DC/DC converter, and the battery charger.

Particularly useful in the solid state lighting device described herein is a light emitting diode series array that contains a plurality of individual light emitting diode elements. The individual LED elements are electrically and mechanically in series. The array includes a first light emitting diode element having an anode region and a cathode region, and a second light emitting diode element also having an anode region and a cathode region. The individual elements are joined into a monolithic array by a conductive, rigid bond region between the cathode region of the first light emitting diode element and the anode region of the second light emitting diode element.

The array includes a positive external lead on the cathode region f the first light emitting diode element; and a negative external lead on the anode region of the second light emitting element.

In order to obtain a non-primary color emitted light, preferably "white light". The individual LED elements are compositionally different, and they therefore differ in band gaps. This results in different wavelengths being emitted by the different individual LED elements. The individual elements emit different colors. The light emitting diode elements differ in band gaps and separately emit different colors that when properly selected and engineered are optically additive to a non-primary color, preferably white light.

The number of individual LED elements is a matter of design choice, where, for example, a third light emitting diode, and even more diodes, may be arrayed between the first and second light emitting diodes, electrically in series therewith and bonded thereto to provide three or more light emitting diodes electrically and mechanically in series. In this case where the individual light emitting diode elements emit different primary color to thereby cause the monolithic light emitting diode array to effectively emit white light.

Generally, at least one of the light emitting diode elements comprises doped GaIn. This is generally at various doping levels and regions within the light emitting diode element, with regions of p-GaP, AlInGaP, n-AlInGaP, and an n-GaAs substrate.

In one embodiment the array is a linear array.

In a preferred exemplification the conductive, rigid bond region is a solder alloy. The solder alloy is preferably a eutectic (melting point minimum) alloy. One particularly desirable solder alloy is a gold-tin eutectic alloy. This solder bond may be formed by providing a gold-tin alloy layer on one light emitting diode element and a gold pad on a facing surface of another light emitting diode element, and heating the array to form a conductive bond.

Alternatively, the conductive, rigid bond region is a conductive polymer. Conductive polymers include chalcogen containing phenylene polymers. In still another embodiment of our invention the conductive, the rigid bond region is a metallically semiconductor alloy, that is, a region of the semiconductor having a sufficiently high concentration of one or more dopants to exhibit metallurgical conduction.

BRIEF DESCRIPTION OF THE DRAWINGS

Various aspects of our invention are illustrated in the FIGS. appended hereto.

FIG. 8 illustrates a battery charger for NiMH and NiCd batteries. The battery charger includes a diode rectifier, voltage regulators, and a microprocessor. The microprocessor allows various modes of recharge control, such as back voltage, internal resistant, time integrated current control, and the like.

DETAILED DESCRIPTION

The invention described herein provides a rugged and reliable, fully integrated portable lighting system for outdoor and emergency use. The system includes LEDs, a step up power supply, preferably operating in a pulse mode, at nanosecond level pulses, and an optional rechargeable battery, and integrated battery charger.

Monolithic Light Emitting Diode Array

The light emitting diode series array contains a plurality of individual light emitting diode elements. The individual LED elements are electrically and mechanically in series. The array includes a first light emitting diode element having an anode region and a cathode region, and a second light emitting diode element also having an anode region and a cathode region. The individual elements are joined into a monolithic array by a conductive, rigid bond region between the cathode region of the first light emitting diode element and the anode region of the second light emitting diode element.

The array includes a positive external lead on the cathode region of the first light emitting diode element; and a negative external lead on the anode region of the second light emitting element.

Figure 1:
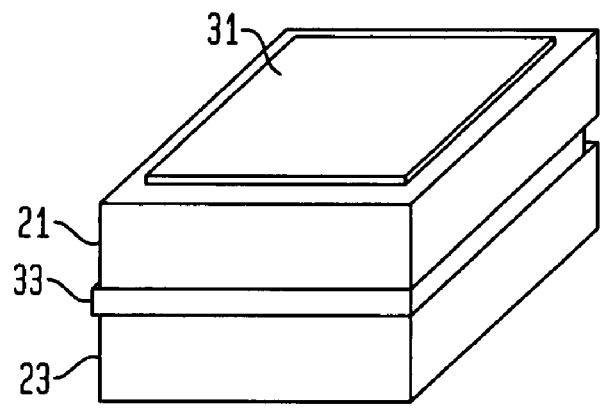
FIG. 1 is a perspective view of a two LED element array, showing one contact pad, the two LED elements with the conductive structural bond.
Figure 2:
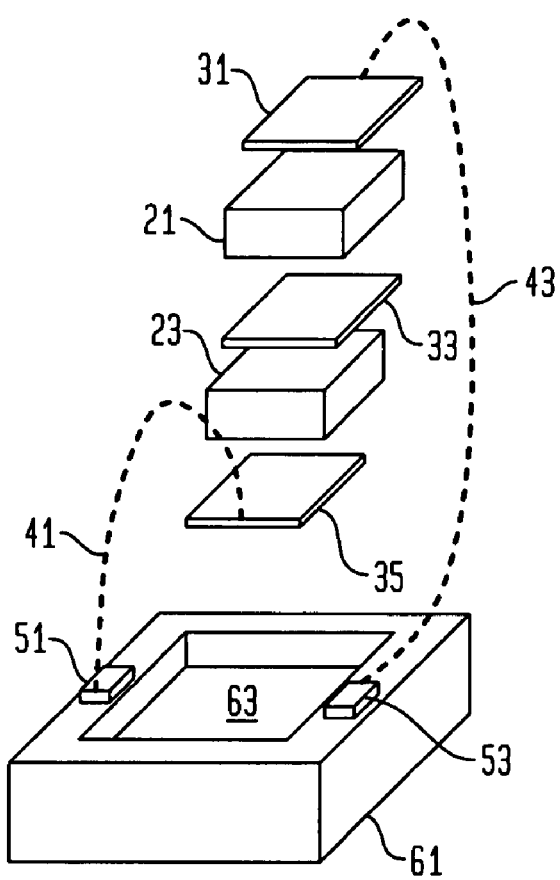
FIG. 2 is an exploded perspective view of the two LED element array of FIG. 1 showing one form of a package.

This is illustrated in FIGS. 1 and 2. FIG. 1 is a perspective view of a two LED element array, showing one contact pad, the two LED elements with the conductive structural bond. FIG. 2 is an exploded perspective view of the two LED element array of FIG. 1 showing one form of a package. As illustrated in FIGS. 1 and 2, two individual LED elements, 21 and 23, are joined at a conductive structural bond, 33. The array also includes two leads, only one of which, lead 31, is illustrated.

FIG. 2 illustrates the two element array of FIG. 1 with the two individual LED elements, 21 and 23, joined at a conductive structural bond, 33. Contacts pads, 31 and 35, are on opposite surfaces of the LED array. Wire leads 41 and 43 connect the contact pads 31 and 35 to matching contact pads, 51 and 53, on the package, 61. The package is illustrated as a recessed package, 61, having a cavity 63 therein to support the two element array. It is to be understood that the package, 61, may also include a hermetic seal, not shown.

In order to obtain "white light" the individual LED elements are compositionally different, and they therefore differ in band gaps. This results in different wavelengths being emitted by the different individual LED elements. The individual elements emit different colors. The light emitting diode elements differ in band gaps and separately emit different colors that when properly selected and engineered are optically additive to white light.

With respect to the extrinsic material, and the dopants, in a semiconductor material characterized by direct recombination, considerable light may be emitted from a forward biased junction. This is called injection photoluminescence and is the basis of light emitting diodes. The frequency (or, the dual of frequency, the wavelength) of emissions is determined by the band gap or energy gap of the semiconductor pair. There is a wide variation in band gaps, and accordingly, in available emitted photon energies. Various semiconductors may range from the ultraviolet (at 3.6 eV for ZnS) into the far infrared (at 0.18 eV for InSb).

Mixed semiconductors increase the number and range of photon energies (and the spectrum of the emissions). One such example is gallium arsenide-phosphide, GaAs-GaP. As the percentage of As is reduced (and, concomitantly, the percentage of P is increased), the resulting band gap from the "direct" 1.4 eV bandgap of GaAs in the far infrared region to the "indirect" 2.26 eV bandgap of GaP in the green region. As the ratio of P to total P plus as goes above 0.44, the recombination mechanism is "indirect" and radiative recombination becomes unlikely. As a general rule, the ratio of P to P plus As (i.e., $GaAs_{1-x}P_x$ where x is the ratio of P to P plus As) is kept at below 0.40. At x=0.40, the recombination is direct, allowing relatively efficient radiative recombination (and therefore emission). The emission of $GaAs_{0.6}P_{0.4}$ is at about 1.8 eV in the red portion of the spectrum.

Doping of $GaAs_{1-x}P_x$ with nitrogen shifts the output to the yellow-green portion of the visible spectrum.

Within the visible spectrum, $GaAs_{1-x}P_x$ (as note above), CdSe, CuBr (2.9 eV), ZnSe (2.7 eV), $In_2O_3$ (2.7 eV), CdS (2.5 eV), ZnTe (2.3 eV), and GaSe (2.1 eV) are viable LED semiconductor materials. With proper semiconductor engineering and matching of semiconductors it is possible to provide an additive combination of emissions that produces a clean, clear white light.

Generally, at least one of the light emitting diode elements comprises doped GaIn, wherein doping may occur at various levels. In addition, any single light emitting diode element may contain regions having different compositions, e.g., p-GaP, AlInGaP, and n-AlInGaP. Typically, an n-GaAs substrate is employed.

In one embodiment the array is a linear array.

The number of individual LED elements is a matter of design choice, where, for example, a third light emitting diode, and even more diodes, may be arrayed between the first and second light emitting diodes, electrically in series therewith and bonded thereto to provide three or more light emitting diodes electrically and mechanically in series. In this case where the individual light emitting diode elements emit different primary color to thereby cause the monolithic light emitting diode array to effectively emit white light.

Figure 3:
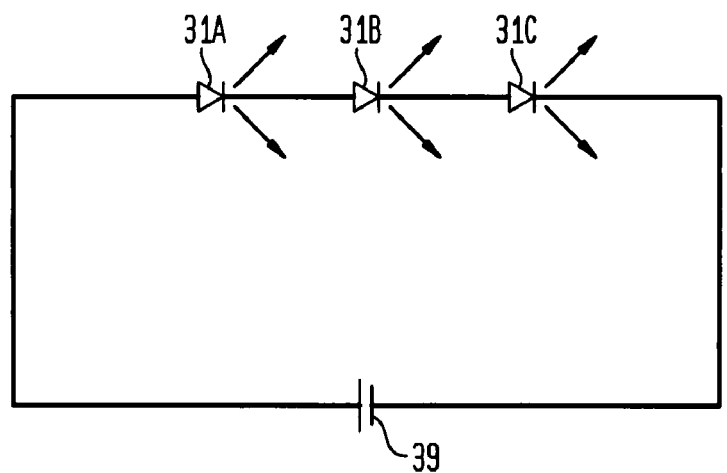
FIG. 3 is a circuit diagram of a three LED element array adapted for direct current power.
Figure 4:
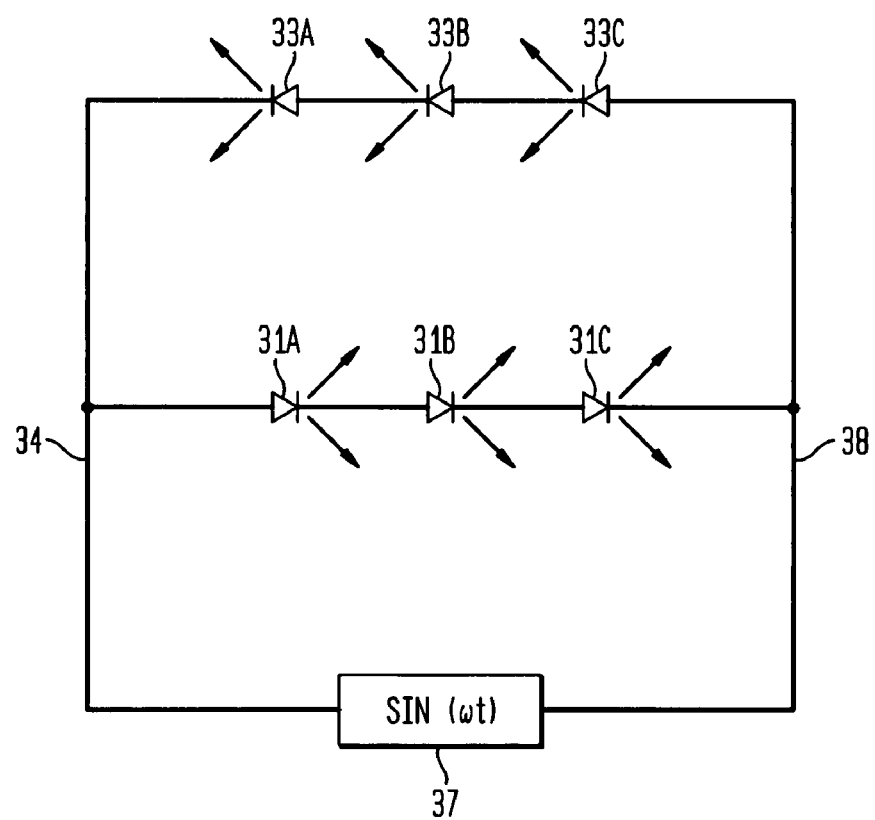
FIG. 4 is a circuit diagram of a six LED element array adapted for alternating current operation with three LED elements emitting during the positive phase and the other three LED elements emitting during the negative phase.

This is illustrated in FIGS. 3 and 4. FIG. 3 is a circuit diagram of a three LED element array adapted for direct current power. While this particular circuit is described with respect to direct current, it is to be understood that it could be used with unrectified alternating current with a duty cycle less than 50 percent and possibly some flicker.

The circuit of FIG. 3 includes a power supply 39 and three LED elements, 31A, 31B, and 31C electrically in series.

FIG. 4 is a circuit diagram of a six LED element array, with two rows or series of LED elements, the rows or series of LED elements having the elements electrically in series, and the rows or series being electrically in parallel but of opposite polarity. The total array is adapted for alternating current operation with one series or row of three LED elements emitting during the positive phase and the other series or row of three LED elements emitting during the negative phase. Such a circuit finds utility for an "emergency lantern" or "earthquake light" or "fire light" drawing alternating current for illumination and battery charging during "normal" operation, and running on battery power during "emergency" operation.

The circuit of FIG. 4, adapted for alernating current operation, includes a first series or row shown here as three individual LED elements, 31A, 31B, and 31C, arrayed in series in a first polarity, shown for the positive phase of the alternating current signal, and a second series or row, shown here as three individual LED elements, 33A, 33B, and 33C, arrayed in series of opposite polarity to the first row or series, shown for the negative phase of the alternating current signal. The alternating current power supply is shown as element 37, denominated at "sin (wt)" And the two rows or series of light emitting diodes are electrically in parallel through leads, contacts, or connections 34 and 38.

In a preferred exemplification the conductive, rigid bond region is a solder alloy. The solder alloy is preferably a eutectic (melting point minimum) alloy. One particularly desirable solder alloy is a gold-tin eutectic alloy. This solder bond may be formed by providing a gold-tin alloy layer on one light emitting diode element and a gold pad on a facing surface of another light emitting diode element, and heating the array to form a conductive bond.

The conductive, rigid bond region may alternatively be a conductive polymer. Conductive polymers include chalcogen containing phenylene polymers.

In still another embodiment of our invention the conductive, rigid bond region is a metallically conductive region of semiconductor alloy.

System Overview

Figure 5:
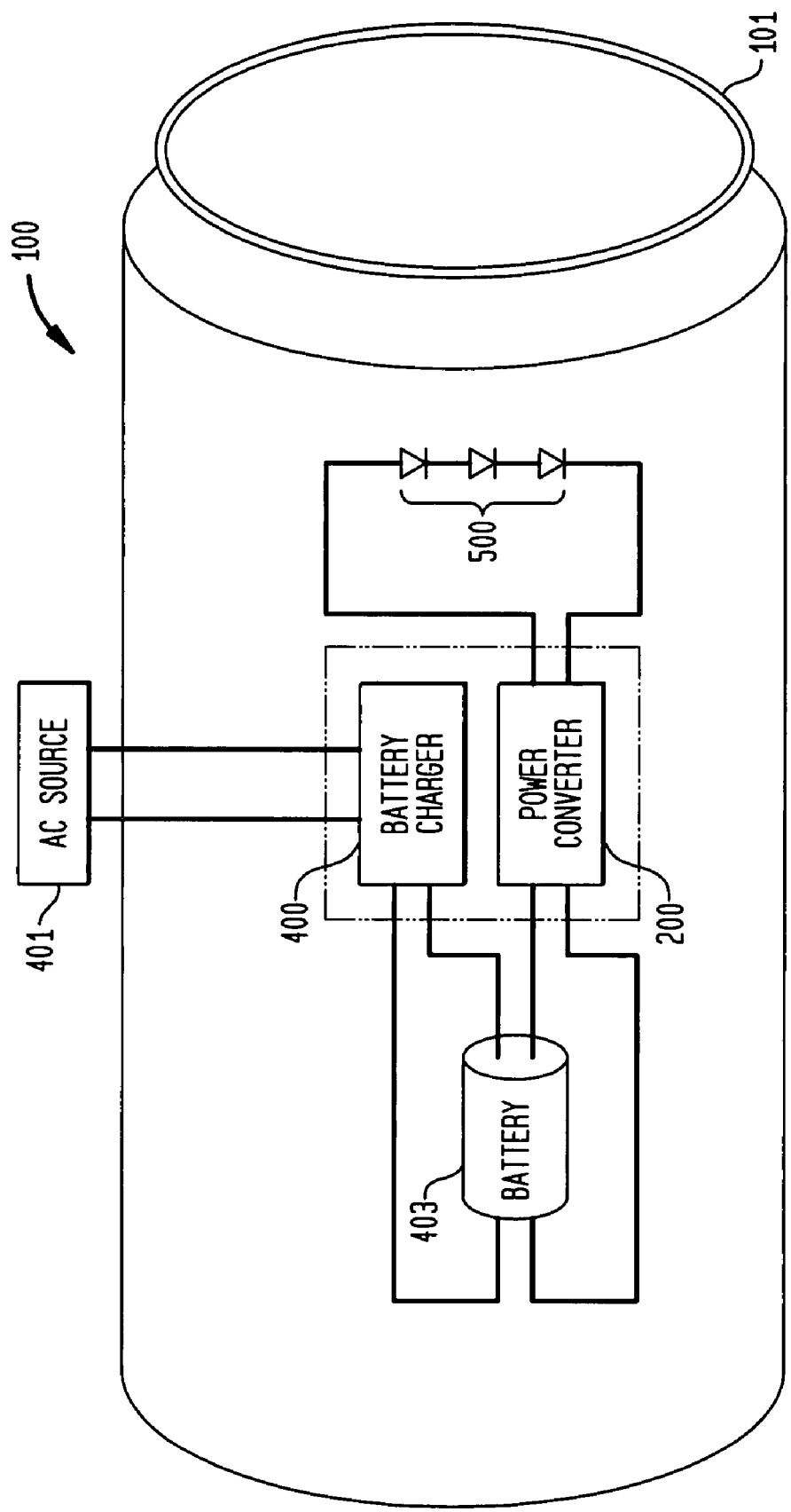
FIG. 5 shows a phantom view, in partial three-quarters perspective, of a light assembly of the invention, here a flashlight. The light assembly includes a series LED, a battery charger, a power converter, and a battery, all in a suitable container, and an external AC source.

FIG. 5 illustrates, in phantom view, in partial three quarter's perspective, of a light assembly, 100, of the invention, here a flashlight. The light assembly includes a series LED, 500, a battery charger, 400, a power converter, 200, a battery, 403, and a lens, 101, all in a suitable container, and an external source, 401, which may be connected directly to AC or which may receive rectified, transformed DC. Generally, the terms "power converter," "power supply," "switching mode power supply," "DC/DC step up converter," "current regulated step-up DC/DC converter," and "switching mode DC/DC step up converter," are intended to be synonymously used herein. It is to be understood, however, that these terms may not be synonymously used in all contexts. For example, in some instances, a DC/DC step up converter may be considered a component of a switching mode power supply. In other instances, a DC/DC step up converter may be considered a separate unit that is used in conjunction with an AC power supply.

The light assembly, 100, is intended for use with a low voltage power source and has a plurality of semiconductor photo-emitters (e.g., LEDs), 500, electrically in series. The light emitter series, 500, is characterized by a higher forward voltage drop than an associated low voltage power source, 403. This requires a current regulated step-up DC/DC converter, 200, for stepping up voltage from the associated low voltage power source, 403, to the semiconductor light emitter series, 500.

DC/DC Step-Up Converter

The power supply, 200, in the solid state lighting device, 100, described herein is a switching mode power supply, 200. A switching mode power supply DC/DC step-up converter, 200, accepts a DC voltage input and provides a regulated DC output voltage. The regulated DC output voltage is higher than the DC input voltage. The basic circuit of a DC/DC step-up converter is shown in FIG. 6.

Figure 6:
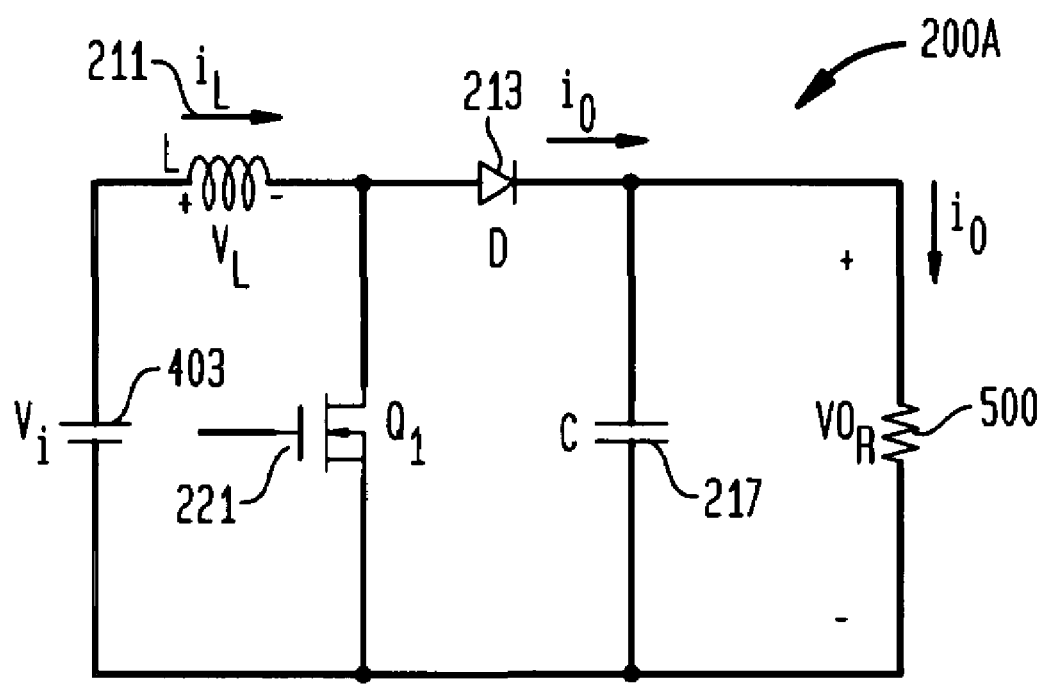
FIG. 6 is a simplified, high level circuit diagram of a power converter, a voltage source and inductor as the input section, a MOSFET switch, and an output section of a diode (which is preferably a Schottky diode but is illustrated as semiconductor junction diode for generality), an output capacitor, and an output resistive load, representative of an LED series.

FIG. 6 shows is a simplified, high level circuit diagram of a power converter, 200A. The elements of the DC/DC step up converter, 200A, includes a connection to a low voltage source, 403, and an inductor, 211, as the input section, a MOSFET switch, 221, and an output section of a diode, 213, (which is preferably a Schottky diode but is illustrated as semiconductor junction diode for generality), an output capacitor, 217, and an output resistive load, 500, representative of an LED series. When the MOSFET switch, 221, is turned on, the voltage supply, 403, is applied across the inductor, 211. However, because of energy stored in capacitor, 217, the diode, 213, is reverse biased by the voltage across the parallel capacitor, 217, and load, 500. Meanwhile, energy builds up across the inductor, 211. When the switch, MOSFET, 221, is closed the energy stored in the inductor, 211, and the diode, 213, conducts, delivering a voltage across the output load, resistor, 500, and the capacitor, 217. Both energy stored in the inductor, 211, and energy from the external circuit, 403 is applied to the load, 500.

The energy to the load, 500, is delivered to the load, 500, in the form of a pulsed flow. From a conservation of energy and conservation of charge perspective, and balancing "volt-seconds" across the inductor, $$V_i \times \delta t = (V_i - V_o) \times (1-\delta)t$$

Collecting terms and rearranging yields $$V_o = V_i/(1-\delta)$$

Controlling the duty cycle, $\delta$, regulates the output voltage, $V_o$, at a constant input voltage, $V_i$. Since the duty cycle is, by definition, less then 1, the DC/DC step-up power converter, 200A, steps up the voltage and delivers pulsed current. Generally, the duty cycle is on the order of 0.10 to 0.70, the "on" time is on the order of about 1 to about 100 microseconds, and the frequency of the resulting LED emission is at least about 100 hertz to avoid undesirable perceptible levels of flicker.

Figure 7:
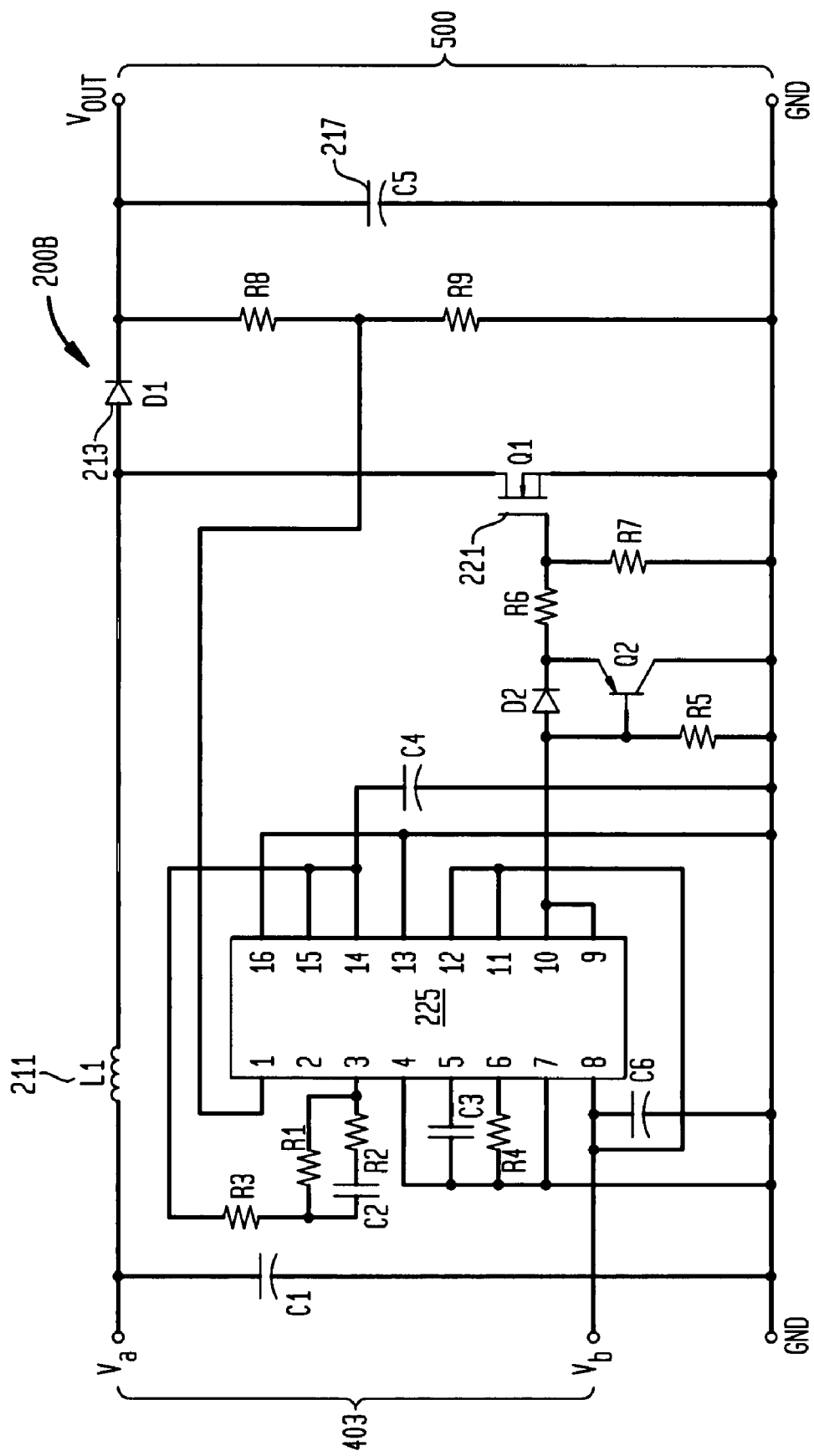
FIG. 7 is an alternative power converter having an integrated circuit as the switching element, an inductor, and various capacitors, inductors, and diodes for operation.

FIG. 7 is an alternative power converter, 200B, having an integrated circuit, 225, as the switching element, an inductor, 211, and various capacitors, inductors, and diodes for operation.

The current regulated step-up DC/DC converter includes an input inductor, 211, in series with the low voltage power supply, 403, an output circuit including an output diode, 213, electrically in series with a resistor load, 500, and capacitor circuit, 217; and a switch, 221, switchably between the input inductor, 211, and two alternative paths, a ground, and an output circuit. In operation when the switch, 221, is on the voltage across the output circuit reverse biases the output diode, 213, and the low voltage power source, 403, charges the input inductor, 211. But, when the switch, 221, is off the output diode, 213, is forward biased allowing energy to pass to the output circuit and cause the semiconductor photo-emitter, 500, to emit.

In a preferred exemplification the switch that is switchable between the input inductor, 211, and either the ground or the output circuit has a MOSFET transistor having balanced on resistance and gate charge.

This balance can be accomplished by providing (within integrated circuit 225) as the switch element two MOSFET transistors, a first MOSFET transistor and a second MOSFET transistor, in parallel. The first transistor is smaller in size and therefore has less dynamic loss then the second transistor and is controlled to supply load during switching. The second transistor is larger in size and therefore has less conduction loss than the first transistor; and is controlled to be off during switching and on to supply current to the output circuit during on cycles.

In a preferred exemplification at least one of the MOSFET transistors is an NMOS transistor. In a particularly preferred exemplification both of the MPOSFET transistors are NMOS transistors.

The illustrated blocking diode, 213, that is in the output circuit and electrically in series with a resistor load, 500, and capacitor circuit, 217, is preferably a Schottky diode.

One particularly desired DC/DC step-up power converter is a Fairchild Semiconductor FAN5608. This is a current regulated step-up, DC/DC converter capable of driving up to twelve LEDs in two channels of six LEDs each with currents of up to 20 milliamperes. Other simplified invertors are also available from other manufacturers such as Sipex, Maxim, and Linear Technologies.

Integrated System

Figure 10:
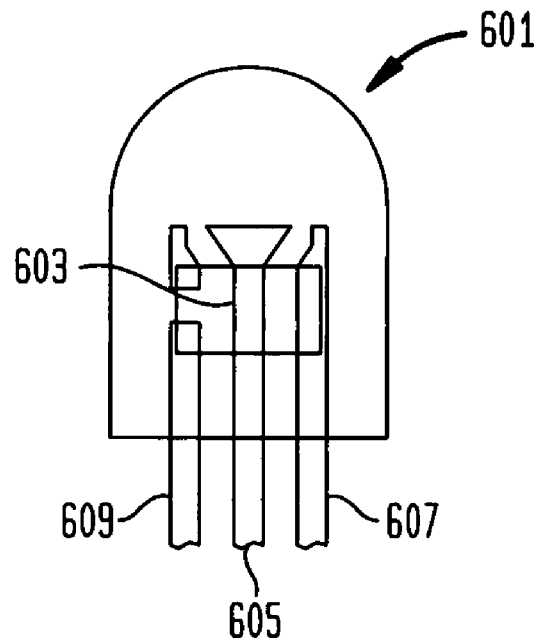
FIG. 10 illustrates one package of the invention. The package contains active and passive elements in a standard lead frame.

The light assembly includes a package carrying the semiconductor photo-emitters (LEDs), 500, and the step-up DC/DC converter, 200. FIG. 10 illustrates one typical circuit package, 601, with passive circuit elements and an Fairchild FAN5608 power converter, 603, or similar power converter in a small (3 millimeter by 4 millimeter) area. The center lead, 605, of the package, 601, shown in FIG. 10 is a ground lead. Lead, 607, is connected to the positive electrode of a battery. Lead, 609, is connected to the positive terminal of the power converter, 200, with the portion of lead below the power converter, 200, providing structural rigidity, but no circuit function.

Figure 11:
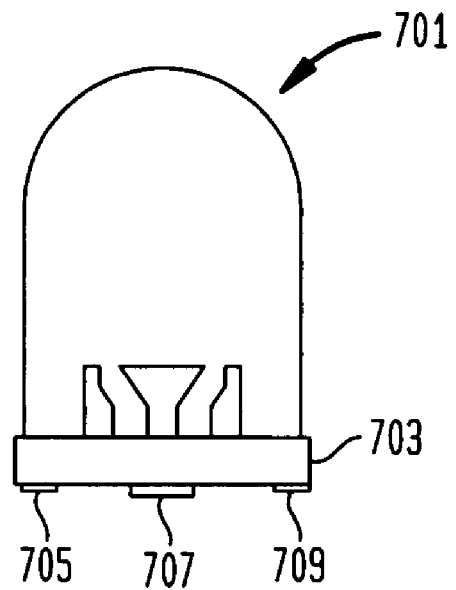
FIG. 11 illustrates an alternative package with the power converter at the bottom of package.

An alternative circuit package, 701, is shown in FIG. 11. The electrical connection between the power converter and the LED is made to the LED lead, 703. The power converter circuit, 200, can be made on a portion of the circuit board, with the connection between the LED leads, 705, 707, 709 and the circuit board (carrying the power converter) by standard pin in hole soldering. Electrical connections to the battery can be made from the bottom side of the printed circuit board.

Figure 12:
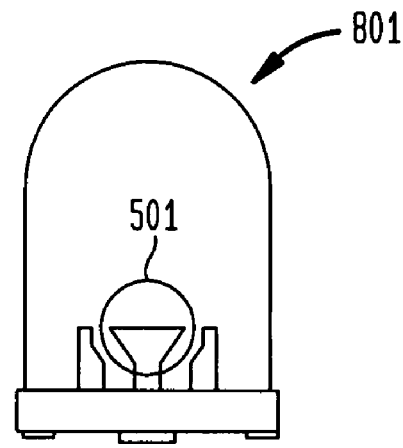
FIG. 12 illustrates an alternative package capable of carrying a stacked array of LED elements in series.

FIG. 12 illustrates an LED package, 801, adapted to contain a stack of individual light emitting diodes, 501. The individual LED elements, 501, may be wire bonded in series or they may be a monolithic structure.

Figure 13:
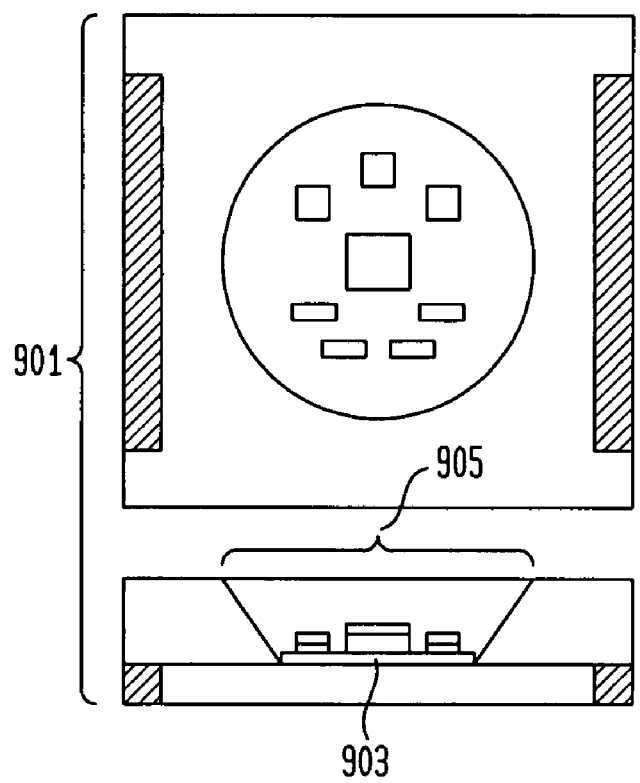
FIG. 13 illustrates an LED package adapted for surface mount.

FIG. 13 illustrates a package, 901, where an efficient heat dissipating substrate, 903, such as a ceramic or metal substrate, 903, is used. All of the optical elements, semiconductor elements (as the power converter, 200), and the passive elements 905 (as the diodes, inductors, and capacitors) can be incorporated on one substrate, 903. The populated substrate, 903, can be placed in the package, 901, which may be a surface mount package.

Battery Charger

The light assembly, 100, may include a battery charger, 400, having an input for a charging current, a current control element, and a voltage regulator for delivering charging current to a battery to be charged.

Figure 8:
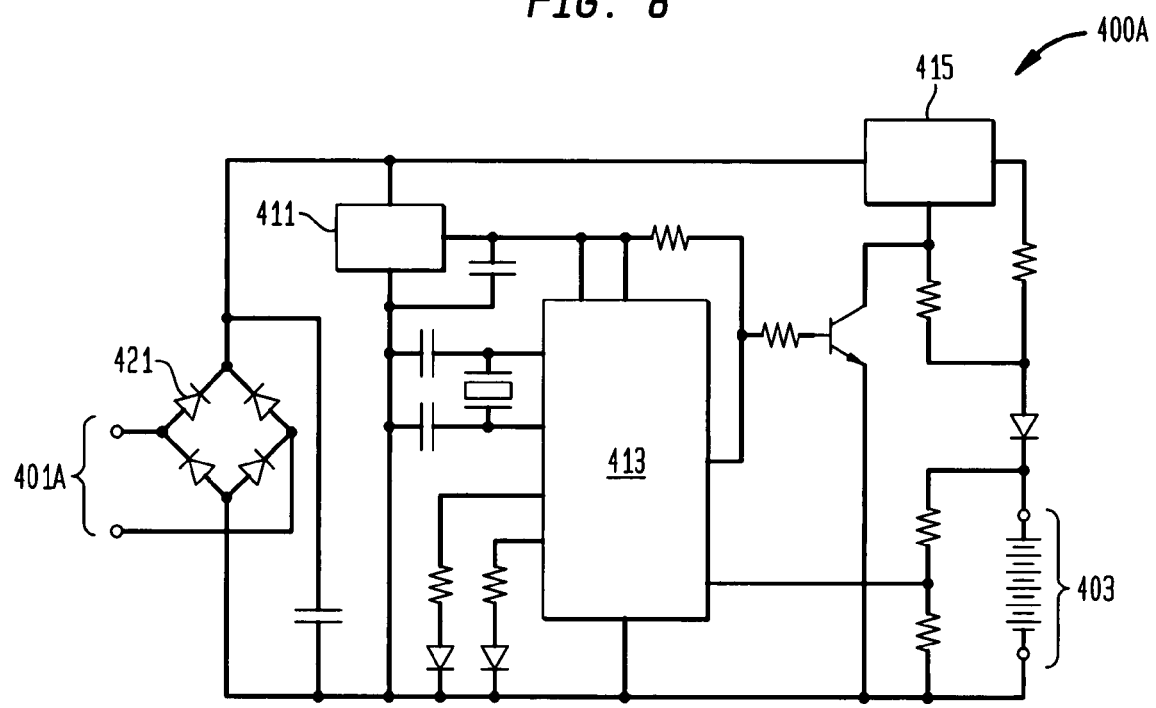

FIG. 8 illustrates a battery charger, 400A, for NiMH and NiCd batteries, 403. The battery charger receives AC, 401A, and includes a diode rectifier, 421, voltage regulators, 411, 415, and a microprocessor, 413. The microprocessor, 413, allows various modes of recharge control, such as control against back voltage, control against internal resistance, control by time integrated current control, and the like.

Figure 9:
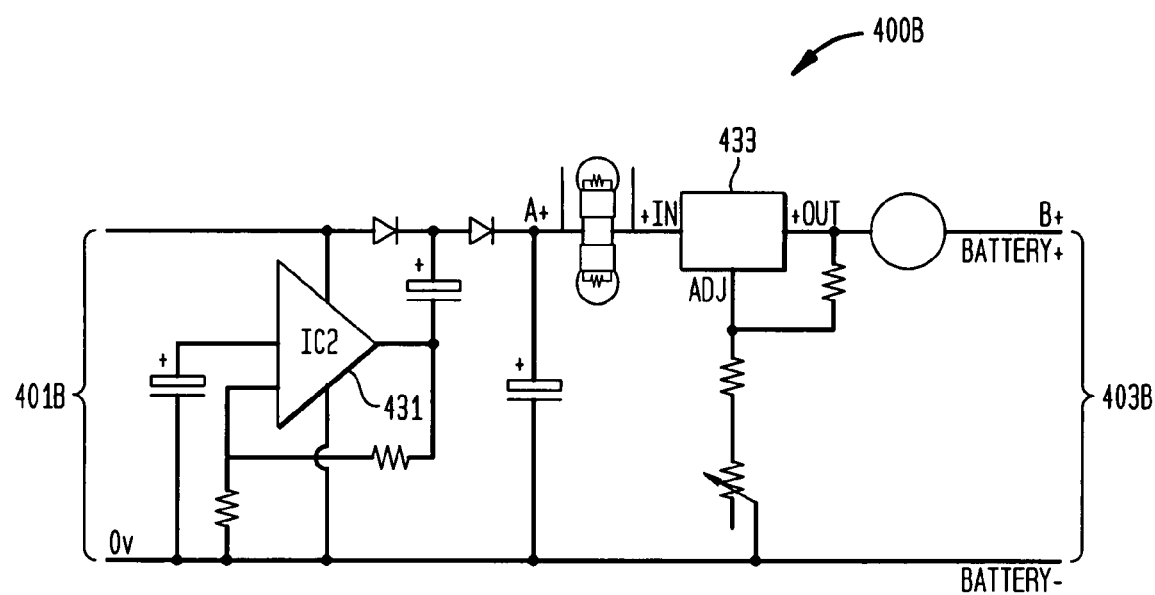
FIG. 9 illustrates a battery charger for Li Ion batteries, where the battery charger receives rectified and transformed current from a typical microelectronic appliance, wall socket rectifier/transformer.

FIG. 9 illustrates a battery charger, 400B, for Li Ion batteries, where the battery charger receives rectified and transformed current, 401B from a typical microelectronic appliance, wall socket rectifier/transformer, amplifies it in amplifier 431, and passes it to the battery, 403B under the control of voltage controller, 433.

When present the battery charger may be mounted on the same package with the semiconductor photo-emitters, and the step-up DC/DC converter.

The Light Emitting Diodes and the Light Emitting Diode Series

An individual cup, such as element 501 in FIG. 12 and element 905 in FIG. 13, may carry more than one LED element, as shown in FIG. 12. The LED elements can be discrete LED elements serially connected by LED to LED wire bonding or they can be a mechanically bonded monolithic structural element. One advantage of combining LED elements is that additive colors can be obtained. For example red, green, and blue LED elements can be combined in series to yield high quality white light can be obtained.

The present invention may also utilize stacked-chip semiconductor light emitting devices, as shown in FIGS. 10, 11, and 12.

Semiconductor light emitting devices, commonly known light emitting diodes (LEDs), have been available in various packages, including, for example, single, lamp type devices and surface mount types. SMT types are available for special applications where package height is limited. One such surface mount type LED is a side-view LED. Light from a side view LED is illuminated from a side and goes into a light guide in a small size display such as a cellular phone or a PDA.

Most of the side-view LEDs emit white light. They are used for small to medium size (1-5") low performance displays. The light source for advanced LCD displays is white light predominantly from cold cathode fluorescent lamp (CCFL).

The white light is separated into three primary colors when it reaches a color filter located on the top of a LCD module. By turning on liquid crystal cells in a pattern, which correspond the predetermined color pixel, an image is defined on a screen.

The simplest and the most popular method of generating white light is using wavelength converting phosphors on top of a high energy LED chip. Typically a blue LED chip is coated with a phosphor. The phosphor converts some of the blue light into yellow. When yellow and blue colors mix together in the phosphor layer, (a mixture of a thermosetting polymer and a phosphor), the escaping light becomes white.

However, the white light generated by this method of wavelength conversion does not have enough red color. When phosphor converted white LEDs are used as the light source for a display, pictures are not clear and in most cases hazy. The color gamut of this type of display is much worse than that of a CRT or a flat panel with fluorescent lamps.

Better white light can be achieved by mixing three primary colors, red, green, and blue. An LCD backlighting system using a number of red, green, and blue LEDs has been demonstrated. Color gamut of the display with LED back light was 100% of NTSC. Chromatic performance of single in line LED arrangement is good. However, a careful measure should be devised in order to properly mix the three colors from individual LED, before the mixed white color enter the light guide.

Figure 14:
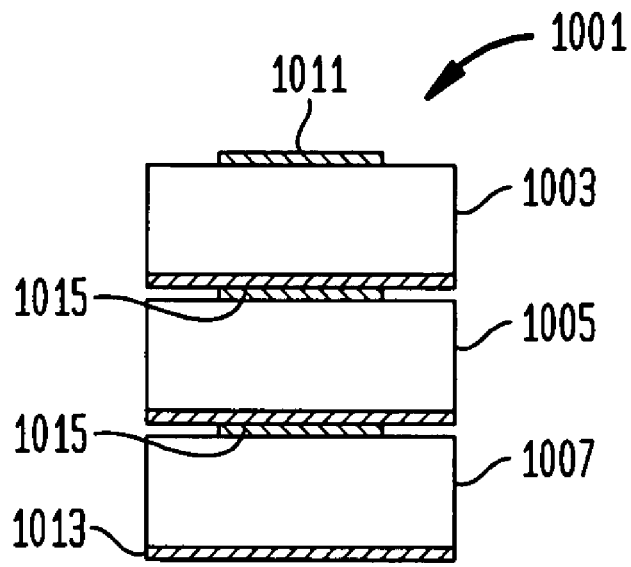
FIG. 14 illustrates a solder bonded, stacked LED structure useful in implementing the light of out invention.

A stacked LED package, 1001, may be utilized with the invention. FIG. 14 depicts an exemplary stacked LED package, 1001, that has multiple LED chips, 1003, 1005, 1007, on top of each other.

Stacked LEDs present connectivity challenges. For example, prior art single chip LED packages frequently have two wire-bonds on the surface of the die. Two wire bonds are required on the top surface of the die because of the bonding pad arrangement of the LED chip.

However, more advanced LED chips have only one bonding pad on the top surface of a chip. Typically the bottom electrode is coated with a gold or a gold/tin eutectic layer. The electrode is bonded to the lead, lead frame or PCB, by gold to gold compression bonding, eutectic brazing, or using a conductive die attach material depending on the current requirements. In one embodiment, as shown in FIG. 14, a bonding pad 1011 is attached onto a top surface of LED chip 1003, a bonding pad 1015 is attached onto a top surface of LED chip 1005 and a bonding pad 1015 is attached onto a top surface of LED chip 1007. An electrode 1013 is attached to the bottom surface of LED chip 1007 as well as between LED chips 1005, 1007 and between LED chips 1003, 1005. The electrode 1013 can have a gold/tin layer and the bonding pad 1011 can be made from gold.

Figure 15:
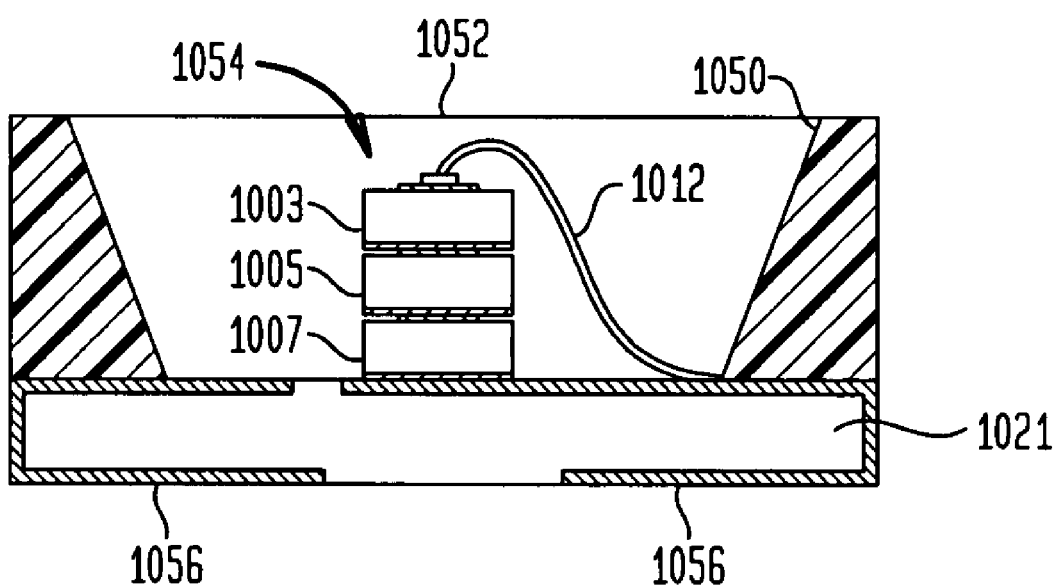
FIG. 15 illustrates a stacked LED package useful in the light of our invention.

Eutectic Gold/Tin Solder, 80Au 20Sn by wt %, is used in joining applications where strength, thermal conductivity, corrosion resistance. AuSn is an effective die attach solder for high performance semiconductor packages. It has a melting point of 280.degree. C. When the Au/Sn layer on one side of a LED chip is placed over a gold bonding pad on another LED chip and heated above 280.degree. C., the two electrodes form an excellent welded joint. By repeating this process a number of chips can be stacked to form one light emitting unit, 1001, as shown in FIG. 14. The bottom electrode, 1013, with Au/Sn layer, is used to attach to the substrate, 1021, lead frame or PCB. A single wire bond, 1012, from the top electrode to the substrate completes assembly, is shown in FIG. 15. As shown in FIG. 15, the assembly includes a housing 1050 for supporting staked LED arrangement 1054 which is sealed with encapsulant 1052. The housing 1050 includes soldering pads 1056 for attachment to a PCB or other structure.

It is noted that LED light generated from the active layer escapes from the sides. Therefore, a stacked chip would not degrade optical performance of the packaged product.

A number of advantages are provided from a stacked LED chip package. First one can increase optical throughput without paying additional packaging cost. When a 3-chip stack is used in one LED package, the cost of achieving 3× optical output will only slightly higher than single package. Also product manufacturers do not have to assemble three LEDs on the PCB, thereby both saving assembly and discrete PCB cost. Second since LED chips are connected in series higher voltage is required to turn on the LED.

The efficiency, that is, the light output per unit of applied electricity, in this mode is much higher than in a parallel connection. Third, by arranging different color LEDs a truly white light can be achieved for the applications such as high performance displays.

Figure 16:
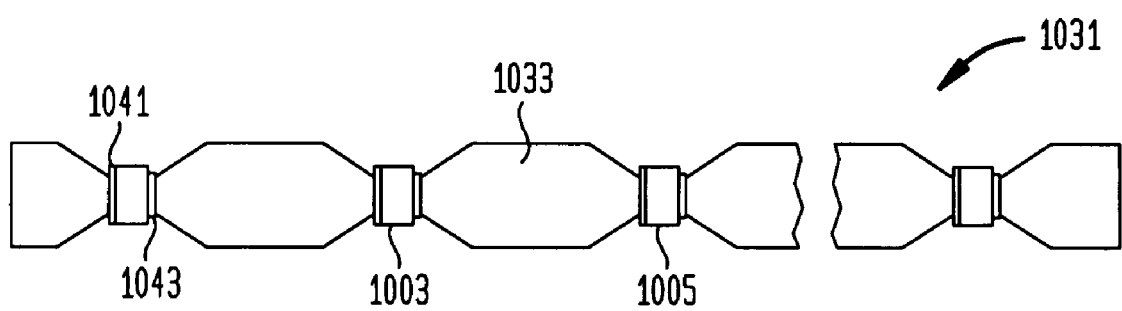
FIG. 16 illustrates a linear stacked LED useful in the light of our invention.

Another example of the present invention is that the stacked structure, 1031, can produce a line light source, as shown in FIG. 16. Extenders, 1033, can be used between LED chips, 1003, 1005. When a fusible mass such as solder is used to bond the surfaces of extenders and LED chips, a coating, 1041, 1043, comprised of gold or another passivation-resistant material on the surfaces may facilitate wetting thereof by the fusible mass. This, in turn, reduces electrical resistance or impedance associated with the bond.

In conjunction with a power supply of appropriate voltage, a plurality of LEDs can be assembled into a line source. For example, a 110 V DC power supply may be used to turn on forty red, green, and blue LEDs with current of only 20-100 mA. While individual light emitting diodes or discrete light emitting diode integrated circuits may be used with or in the practice of the invention, in a preferred embodiment the invention provides a monolithic light emitting diode array that includes a plurality of LED elements connected electrically in series. With a proper reflector design, this type of LED light string can be used for general lighting and special applications such line source for flat panel display.

Mechanically, individual LED chips can be arranged in monolithic arrays or in stacked manner. LED chips are fabricated typically on GaAs, sapphire, or SiC depending on color therefore band-gap. GaAs and SiC are electrically conductive while sapphire is an insulator. Most GaAs and SiC based LED chips have two electrodes on the top and the bottom. Sapphire based LEDs, mostly green and blue, however, typically cannot have top and bottom electrode arrangement. Instead they have two electrodes on the top. Silicon carbide based LEDs can be stacked by placing a second led chip on the top of the first chip and so on. The third light emitting diode between the first and second light emitting diodes, is also electrically in series the first and second light emitting diode elements and bonded thereto to provide three light emitting diodes electrically and mechanically in series.

GaAs or SiC based LEDs have solderable electrodes such as gold or gold-tin eutectic alloy, such as an 80% gold-20% tin alloy. Either brazing or thermosonic compression can be easily exercised. Alternatively a conductive polymer can be used if desired.

Nonconducting substrates such as sapphire can be electrically connected by chip-to-chip wirebonding. In this case the led chips have to be arranged monolithically.

The individual light emitting diode elements will typically differ in band gaps to thereby emit different colors, with the individual light emitting diode elements differing in band gaps and separately emitting different colors that are optically additive to white light. Most commonly at least one of the light emitting diode elements comprises doped GaIn, with layers or regions of p-GaP, AlInGaP, n-AlInGaP, and an n-GaAs substrate.

While our invention has been described with respect to certain preferred embodiments and exemplifications, it is not intended to limit the scope of the invention thereby, but solely by the claims appended hereto.

We claim:

1. A monolithic light emitting diode series array, comprising:
    a first light emitting diode element having an anode region and a cathode region;
    a second light emitting diode element having an anode region and a cathode region;
    a conductive, rigid bond region located between the cathode region of the first light emitting diode element and the anode region of the second light emitting diode element to connect the first and second light emitting diode elements electrically and mechanically in series;
    a positive external lead on the cathode region of the first light emitting diode element;
    a negative external lead on the anode region of the second light emitting element;
    a package having a recess formed therein and having first and second contact pads, the connected first and second light emitting diode elements being located in the recess of the package such that one of the external leads is disposed between a surface of the connected first and second light emitting diode elements and a bottom surface of the recess and another of the leads is disposed on an opposing surface of the connected first and second light emitting diode elements;
    a first wire lead connected between one of the external leads and one of the contact pads; and
    a second wire lead connected between another of the external leads and another of the contact pads.

2. The monolithic light emitting diode array of claim 1 wherein the first and second light emitting diode elements differ in band gaps to thereby emit light of different colors.

3. The monolithic light emitting diode array of claim 2 wherein the light of different colors are optically additive to generate white light.

4. The monolithic light emitting diode array of claim 1 wherein the array is a linear array.

5. The monolithic light emitting diode array of claim 1 wherein the conductive, rigid bond region is a solder alloy.

6. The monolithic light emitting diode array of claim 5 wherein the solder alloy is a eutectic alloy.

7. The monolithic light emitting diode array of claim 6 wherein the eutectic alloy is a gold-tin eutectic alloy.

8. The monolithic light emitting diode array of claim 5 wherein the solder alloy includes a gold-tin alloy layer formed on a surface of one light emitting diode element and a gold pad formed on a facing surface of another light emitting diode element, the gold-tin alloy layer and gold pad together forming a conductive bond.

9. The monolithic light emitting diode array of claim 1 wherein the conductive, rigid bond region is a conductive polymer.

10. The monolithic light emitting diode array of claim 1 wherein the conductive, rigid bond region is a metallically conductive semiconductor alloy.

11. The monolithic light emitting diode array of claim 1 further comprising a third light emitting diode between the first and second light emitting diodes, electrically and mechanically in series therewith and bonded thereto.

12. The monolithic light emitting diode array of claim 11 wherein light emitting diode elements emit light of different primary colors that are optically additive to generate light of a non-primary color.

13. The monolithic light emitting diode array of claim 12, wherein the nonprimary color is white.

14. The monolithic light emitting diode array of claim 1 wherein at least one of the light emitting diode elements comprises doped Gain.

15. The monolithic light emitting diode array of claim 14 wherein the at least one light emitting diode element further comprises regions of p-GaP, AlInGaP, n-AlInGaP, and an n-GaAs substrate.

* * * * *

UNITED STATES PATENT AND TRADEMARK OFFICE
CERTIFICATE OF CORRECTION

PATENT NO.         : 7,397,068 B2                                                        Page 1 of 1
APPLICATION NO.    : 11/010077
DATED              : July 8, 2008
INVENTOR(S)        : Jae M. Park et al.

It is certified that error appears in the above-identified patent and that said Letters Patent is hereby corrected as shown below:

Column 14, line 9, "Gain" should read --GaIn--.

Signed and Sealed this

Thirtieth Day of November, 2010

David J. Kappos
*Director of the United States Patent and Trademark Office*